(12) United States Patent
Wasserman

(10) Patent No.: US 11,164,985 B2
(45) Date of Patent: Nov. 2, 2021

(54) MID-INFRARED DETECTOR USING A HEAVILY DOPED BACKPLANE TO THE DETECTOR STRUCTURE

(71) Applicant: Board of Regents, The University of Texas System, Austin, TX (US)

(72) Inventor: Daniel Wasserman, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 16/641,081

(22) PCT Filed: Aug. 21, 2018

(86) PCT No.: PCT/US2018/047318
§ 371 (c)(1),
(2) Date: Feb. 21, 2020

(87) PCT Pub. No.: WO2019/040486
PCT Pub. Date: Feb. 28, 2019

(65) Prior Publication Data
US 2020/0328320 A1    Oct. 15, 2020

Related U.S. Application Data

(60) Provisional application No. 62/549,858, filed on Aug. 24, 2017.

(51) Int. Cl.
*H01L 31/10*    (2006.01)
*H01L 31/103*   (2006.01)
*H01L 31/0232*  (2014.01)
*H01L 31/0304*  (2006.01)
*H01L 31/18*    (2006.01)

(52) U.S. Cl.
CPC .... *H01L 31/1035* (2013.01); *H01L 31/02327* (2013.01); *H01L 31/03046* (2013.01); *H01L 31/1844* (2013.01)

(58) Field of Classification Search
CPC .......... H01L 31/1035; H01L 31/02327; H01L 31/03046; H01L 31/1844
See application file for complete search history.

(56) References Cited

U.S. PATENT DOCUMENTS 8,750,653 B1    6/2014  Peters et al.
9,647,155 B1    5/2017  Maimon
(Continued)

OTHER PUBLICATIONS

Wang et al. Performance comparison betweem InAs-based and GaSb based type-II superlattice photodiode for long wavelength infrared detection, optics Express vol. 25, No. 3 1629 Feb. 6, 2017 (Year: 2017).*

(Continued)

*Primary Examiner* — Matthew L Reames
(74) *Attorney, Agent, or Firm* — Robert A. Voigt, Jr.; Winstead PC

(57) ABSTRACT

A mid-infrared detector that uses a heavily doped material (e.g., indium arsenide) as a backplane to the detector structure to improve detector performance and fabrication cost. The infrared detector includes a substrate and a backplane of heavily doped material consisting of two or more of the following materials: indium, gallium, arsenic and antimony. The backplane resides directly on the substrate. The infrared detector further includes a photodetector (e.g., type-I or type-II strained layer superlattice (SLS) nBn photodetector, type-I or type-II SLS pn junction photodetector, a quantum-dot infrared photodetector, a quantum well infrared photodetector, a homogeneous material pn junction photodetector) residing directly on the backplane. Additionally, the infrared detector may include a metal structure residing directly on the photodetector. In this manner, the absorption of electromagnetic energy in the photodetector is enhanced.

21 Claims, 1 Drawing Sheet

(56) References Cited

U.S. PATENT DOCUMENTS

| | | |
|---|---|---|
| 2003/0047752 A1 | 3/2003 | Campbell et al. |
| 2007/0090337 A1 | 4/2007 | Ueno et al. |
| 2014/0374701 A1 | 12/2014 | Wei |
| 2016/0365463 A1 | 12/2016 | Lee et al. |
| 2017/0179317 A1 | 6/2017 | Huang et al. |
| 2018/0151515 A1* | 5/2018 | Grayson ............... G01R 27/14 |

OTHER PUBLICATIONS

Zamiri et al., "MWIR Superlattice Detectors Integrated with Substrate Side-Illuminated Plasmonic Coupler," https://www.spiedigitallibrary.org/conference-proceedings-of-spie/9070/1/MWIR-superlattice-detectors-integrated-with-substrate-side-illuminated-plasmonic-coupler/10.1117/12.2050785.short/?SSO=1, MWIR superlattice detectors integrated with substrate side-illuminated plasmonic coupler, Proc. SPIE 9070, Infrared Technology and Applications XL, 90700Y, Jun. 24, 2014, pp. 1-7, See Abstract.

Goldflam et al., "Enhanced Infrared Detectors Using Resonant Structures Combined with Thin Type-II Superlattice Absorbers," https://aip.scitation.org/doi/abs/10.1063/1.4972844, Applied Physics Letters, vol. 109, No. 25, 2016, pp. 1-22.

International Search Report for International Application No. PCT/US2018/047318 dated Nov. 7, 2018, pp. 1-2.

Written Opinion of the International Searching Authority for International Application No. PCT/US2018/047318 dated Nov. 7, 2018, pp. 1-5.

\* cited by examiner

MID-INFRARED DETECTOR USING A HEAVILY DOPED BACKPLANE TO THE DETECTOR STRUCTURE

CROSS REFERENCE TO RELATED APPLICATIONS

This application claims priority to U.S. Provisional Patent Application Ser. No. 62/549,858, entitled "Mid-Infrared Detector Using a Heavily Doped Backplane to the Detector Structure," filed Aug. 24, 2017, which is incorporated by reference herein in its entirety.

TECHNICAL FIELD

The present invention relates generally to mid-infrared (mid-IR) detectors, and more particularly to a mid-IR detector that uses a heavily doped backplane (e.g., n+ indium arsenide) to the detector structure to improve detector performance and fabrication cost.

BACKGROUND

Infrared (IR) detectors are detectors that react to infrared radiation. A mid-IR detector is an IR detector that detects infrared radiation in the range of 2 μm to 30 μm. The mid-IR wavelength range is of vital importance for a range of sensing, security and defense, and fundamental science applications. While mid-IR source development has been accelerated by the demonstration and subsequent commercialization of the quantum cascade laser, the state-of-the-art mid-IR detector (HgCdTe) has remained fixed for the past two or three decades. This could change, however, with a new class of mid-IR detectors based on strained layer superlattice (SLS) materials.

These detectors consist of alternating layers of semiconductors with either type-I or type-II band offsets, which form superlattice minibands with effective band gaps tunable by the choice of materials and control of nanoscale layer thicknesses. Mid-IR detector structures using SLS materials allow for design-dependent, wavelength flexible operation, and are suggested to be able to achieve improved performance over state-of-the-art mid-IR detectors. However, typical SLS detectors have weak absorption, and thus require thick absorber layers (on the order of multiple micrometers of material, and thus many hundreds of nanoscale layers), which increases the materials and time cost of detector growth, as well as decreases tolerances for strain accumulation due to lattice mismatch. In addition, because of the diffusion length of photoexcited carriers, the probability of collection (the chance that a photo-generated electron hole pair will turn into a current) decreases as the absorption event moves farther from the surface (junction) of the detector. This is a result of the longer time it takes the charge to diffuse to the junction where it can then be collected as current, increasing the probability of charge recombination before collection.

Hence, there is significant motivation to design either detector materials, or detector architectures, which are capable of strong absorption in thin (~<1 μm) absorber regions. However, the absorption of typical SLS materials, while possible to engineer, are difficult to increase to the point where significant absorption can occur within a diffusion length of the junction.

SUMMARY

In one embodiment of the present invention, an infrared detector comprises a substrate. The infrared detector further comprises a heavily doped backplane comprising a combination of two or more of the following materials: indium, gallium, arsenic and antimony, where the backplane resides directly on the substrate. The infrared detector additionally comprises a photodetector residing directly on the backplane. Furthermore, the infrared detector comprises a metal structure residing directly on the photodetector.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

As stated in the Background section, there is significant motivation to design either detector materials, or detector architectures, which are capable of strong mid-infrared (mid-IR) absorption in thin (~<1 μm) absorber regions.

The principles of the present invention provide a mid-infrared (mid-IR) detector structure that enhances absorption of electromagnetic energy in photodetectors (e.g., thin film type-II strained layer superlattice (SLS) detectors) utilizing a heavily doped backplane (e.g., heavily doped indium arsenide) to the detector structure. In one embodiment, the present invention includes a mid-IR detector structure that consists of a thin SLS absorber placed in a novel optical cavity capable of supporting strong field confinement and coupling to free space light in a layer thickness on the order of $\lambda_0/30$ using a hybrid cavity design. A description of such a mid-IR detector is provided further below.

Figure 1:
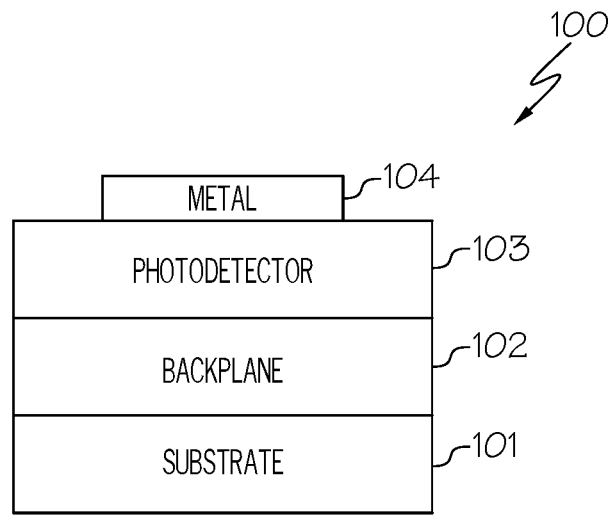
FIG. 1 illustrates a mid-infrared detector utilizing a layer of heavily doped indium arsenide as a backplane to the detector structure in accordance with an embodiment of the present invention.

Referring now to the Figures in detail, FIG. 1 illustrates a mid-infrared (mid-IR) detector 100 utilizing a layer of heavily doped indium arsenide as a backplane to the detector structure in accordance with an embodiment of the present invention.

As shown in FIG. 1, mid-IR detector 100 includes a substrate 101 upon which a highly doped backplane 102, such as n+ indium arsenide (InAs), resides directly on substrate 101. In one embodiment, substrate 101 consists of gallium antimonide (GaSb), gallium arsenide (GaAs), indium arsenide (InAs) or indium phosphide (InP), unintentionally doped or doped.

In one embodiment, backplane (also referred to as the "groundplane") 102 is doped to a high level so that the plasma wavelength is less than the wavelength of the desired enhanced absorption. As a result, backplane 102 may consist of a combination of two or more of the following materials: indium (In), gallium (Ga), arsenic (As) and antimony (Sb). For example, backplane 102 may consist of gallium antimonide (GaSb), indium antimonide (InSb), indium arsenide antimonide (InAsSb), indium gallium antimonide (InGaSb), indium arsenide (InAs) or indium gallium arsenide (InGaAs). In one embodiment, backplane 102 has a thickness of 400 nm and greater depending on the wavelength of operation and doping.

As further shown in FIG. 1, a photodetector active region (absorber) 103 directly resides on layer 102. Various types of photodetectors 103 may reside on layer 102, such as but not limited to, a type-I or type-II strained layer superlattice (SLS) nBn photodetector as discussed below in connection with FIG. 2. In another example, photodetector 103 may be a type-I or type-II SLS pn junction photodetector, where the entire thickness of the photodetector absorbs electromagnetic energy (e.g., light). In another example, photodetector 103 may be a quantum-dot infrared photodetector (QDIP) or a quantum well infrared photodetector (QWIP). In such photodetectors, there may be a thin 10 to 50 nm layer for the top contact. In a further example, photodetector may be a homogeneous material pn junction (e.g., InAs, InGaAs, InSb, InAsSb) photodetector, where the entire thickness of the photodetector absorbs electromagnetic energy.

Furthermore, mid-IR detector 100 may include a metal structure 104 residing directly on photodetector 103, where metal structure 104 was patterned on photodetector 103. It is noted that metal structure 104 may be not be required in mid-IR detector 100 for those photodetectors 103 where a large portion of the thickness of the photodetector absorbs electromagnetic energy. In one embodiment, metal structure 104 corresponds to a metal antenna. For example, the top patterned metal structure 104 may serve as a coupling antenna with minimal loss, as traditional metals in the mid-IR are effectively perfect electrical conductors. Control over the absorption spectra can thereby be achieved by controlling the doping at the InAs/photodetector interface (102/103 interface), or alternatively, by controlling the thickness of photodetector structure 103 or the period and dimensions of metal structure 104. In one embodiment, the thickness of metal structure 104 ranges from 30 to 100 nm. In one embodiment, metal structure 104 consists of any type of metal, such as gold (Au), silver (Ag), platinum (Pt) or copper (Cu).

In one embodiment, a lattice mismatch of substrate 101 with the detector structure can be addressed using a metamorphic buffer layer.

A description of the fabrication process for fabricating mid-IR detector 100 is not provided herein for the sake of brevity as standard fabrication processes (e.g., molecular beam epitaxy, metal organic chemical vapor phase deposition) may be used to grow the mid-IR detector 100, and standard photolithography and metallization may be used to deposit and pattern the metal structure on the detector surface. Embodiments applying such standard fabrication processes would fall within the scope of the present invention.

In one embodiment, the operation of device 100 can be thought of as a hybrid optical cavity. Metal structure 104 couples incident light into photodetector 103. This light sees the interface between backplane 102 and photodetector 103 and is reflected with a phase shift determined by the doping of backplane 102. Because this phase shift is not the typical 0 or π phase shift observed at most dielectric/dielectric or metal/dielectric interfaces, one can obtain an optical cavity for dielectric thicknesses less than λ/4n. The optical cavity confines the light, and at the same time, the light is absorbed in photodetector 103. The strong concentration of the electric field in the cavity then allows one to overcome the weak to moderate absorption coefficient of photodetector 103.

As a result of using a highly doped backplane 102, such as n+ InAs, to mid-IR detector 100, several advantages are achieved.

For example, the active region is not required to be removed from the substrate as required in other infrared devices in an attempt to enhance absorption. Since the present invention grows both backplane 102 (e.g., n+ InAs) and photodetector 103 in the same growth, the metallic backplane is able to be grown monolithically with the detector.

In one embodiment, absorption greater than 50% has been observed in layers as thin as 250 nm.

Furthermore, absorption using mid-IR detector 100 is not strongly angle dependent, and, in fact, remains quite strong up to angles of 65 degrees from normal.

Additionally, the present invention is compatible with all detector fabrication processes along with a flexibility for adjusting to different detector thicknesses. Furthermore, the present invention is designed for strong polarization sensitivity (~10:1), and can also be designed to be polarization insensitive (by replacing the one-dimensional metal periodicity with a pattern having two-dimensional periodicity).

Such advantages are also achieved using a type-II strained layer superlattice (SLS) nBn detector structure as photodetector 103 of mid-IR detector 100 as discussed below in connection with FIG. 2 in accordance with an embodiment of the present invention.

Figure 2:
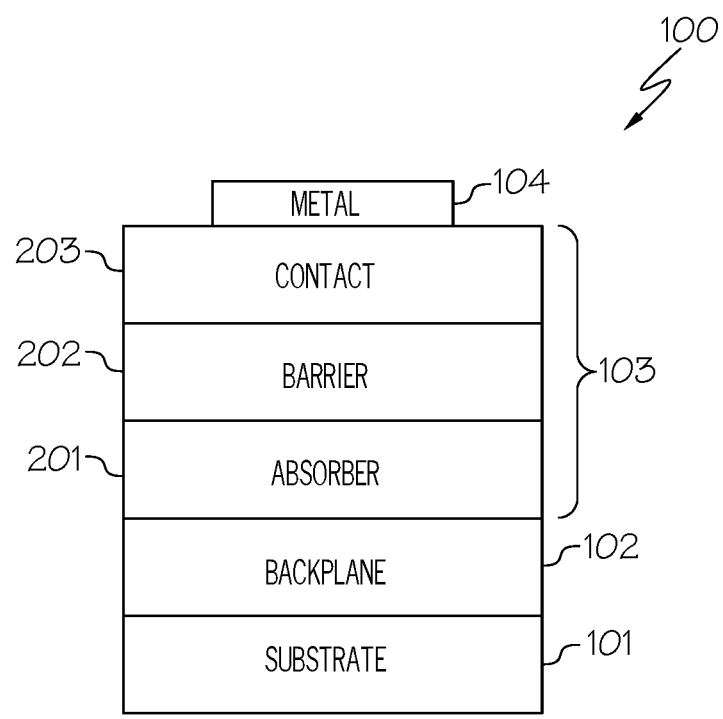
FIG. 2 illustrates the mid-infrared detector of FIG. 1 implementing a type-II strained layer superlattice (SLS) nBn detector structure as the photodetector in accordance with an embodiment of the present invention.

Referring to FIG. 2, mid-IR detector 100 now includes a type-II strained layer superlattice (SLS) nBn detector structure as photodetector 103. In one embodiment, SLS nBn detector structure 103 consists of an absorber layer 201 (e.g., layer of indium arsenide antimonide (InAsSb)), a barrier layer 202 (e.g., layer of aluminum gallium indium antimony (AlGaInSb)) and a contact layer 203 as shown in FIG. 2, where contact layer 203 resides directly on top of barrier layer 202, which resides directly on top of absorber layer 201, which resides directly on top of backplane 102. In one embodiment, absorber layer 201 has a thickness of less than 1 μm. In one embodiment, contact layer 203 (e.g., n-type InAsSb) is a thin layer with a thickness between 0.2-0.3 μm.

A metal structure 104 is then patterned above the epitaxially grown backplane/SLS detector. In one embodiment, metal structure 104 directly resides on contact layer 203. In one embodiment, metal structure 104 corresponds to a metal antenna. In one embodiment, metal antenna 104 couples incident light into SLS detector structure 103.

In one embodiment, mid-IR detector 100 of FIG. 2 is effectively a hybrid design. The bottom backplane/SLS interface (102/103 interface) allows one to engineer the phase of reflection at the interface by controlling the doping (and thus the permittivity) of backplane 102.

Additionally, while mid-IR detector 100 achieves 50% absorption with exceptionally thin absorber layers, the thickness constraints of the absorber design are able to be relaxed thereby achieving up to 70-80% absorption with absorber regions on the order of 1 μm thick.

As discussed above, traditional IR detectors experience weak absorption in the SLS detector structure. As a result, traditional IR detectors require thick absorber layers (on the order of multiple micrometers of materials, and thus many hundreds of nanoscale layers) to absorb more light. Furthermore, because of the diffusion length of photoexcited carriers, the probability of collection (the chance that a photogenerated electron hole pair will turn into a current)

decreases as the absorption event moves farther from the surface (junction) of the detector.

However, the present invention achieves a peak SLS absorption of ~50% at a designed wavelength for a SLS absorber of thickness 170 nm. For comparison, the same thickness of SLS would absorb <<5% of incident light without the surrounding doped backplane and metal pattern. As a result of the design of the present invention, IR detectors are now much more efficient while minimizing growth times and cost. Second, the collection efficiency of the detectors is improved significantly as effectively all photo-generated holes would be collected due to the ultra-thin SLS absorber. Thus, the overall efficiency of the detector would increase.

The present invention strongly enhances SLS absorption in SLS layers from 250-1,250 nm. Thus, for a material system with a given diffusion length, one can design a surrounding structure to strongly enhance absorption for a detector with a thickness less than the minority carrier diffusion length. Moreover, the growth of thin detectors will reduce costs associated with the epitaxial growth of thick SLS detectors, and perhaps relax the requirements on strain in the absorber superlattices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. An infrared detector, comprising:
    a substrate;
    a heavily doped backplane comprising one or more of the following: gallium antimonide, indium antimonide, indium arsenide antimonide, indium gallium antimonide, indium arsenide and indium gallium arsenide, wherein said backplane is doped to a level such that its plasma wavelength is less than a wavelength of a desired absorption, wherein said backplane resides directly on said substrate; and
    a photodetector residing directly on said backplane.

2. The infrared detector as recited in claim 1, wherein said substrate comprises one of the following: gallium antimonide, gallium arsenide, indium arsenide and indium phosphide.

3. The infrared detector as recited in claim 1, wherein said backplane comprises indium arsenide.

4. The infrared detector as recited in claim 1, further comprising:
    a metal structure residing directly on said photodetector.

5. The infrared detector as recited in claim 1, wherein said backplane has a thickness of 400 nanometers or greater.

6. The infrared detector as recited in claim 4, wherein said photodetector comprises a type-II strained layer superlattice nBn detector structure.

7. The infrared detector as recited in claim 6, wherein said type-II strained layer superlattice nBn detector structure comprises:
    an absorber layer;
    a barrier layer residing directly on said absorber layer; and
    a contact layer residing directly on said barrier layer.

8. The infrared detector as recited in claim 7, wherein said metal structure resides directly on said contact layer.

9. The infrared detector as recited in claim 7, wherein said absorber layer comprises indium arsenide antimonide.

10. The infrared detector as recited in claim 7, wherein a thickness of said absorber layer is less than one micrometer.

11. The infrared detector as recited in claim 7, wherein said barrier layer comprises aluminum gallium indium antimony.

12. The infrared detector as recited in claim 7, wherein said contact layer comprises indium arsenide antimonide.

13. The infrared detector as recited in claim 7, wherein said contact layer has a thickness between 0.2 and 0.3 micrometers.

14. The infrared detector as recited in claim 6, wherein said metal structure couples incident light into said type-II strained layer superlattice nBn detector structure.

15. The infrared detector as recited in claim 1, wherein said photodetector comprises a type-I strained layer superlattice nBn detector structure.

16. The infrared detector as recited in claim 1, wherein said photodetector comprises a type-I or type II strained layer superlattice pn junction photodetector.

17. The infrared detector as recited in claim 1, wherein said photodetector comprises a quantum-dot infrared photodetector.

18. The infrared detector as recited in claim 1, wherein said photodetector comprises a quantum well infrared photodetector.

19. The infrared detector as recited in claim 1, wherein said photodetector comprises a homogeneous material pn junction photodetector.

20. The infrared detector as recited in claim 4, wherein said metal structure comprises a metal antenna.

21. The infrared detector as recited in claim 20, wherein said metal antenna couples incident light into said photodetector.

* * * * *